United States Patent [19]

Kakishita et al.

[11] Patent Number: 4,829,463

[45] Date of Patent: May 9, 1989

[54] PROGRAMMED TIME-CHANGING COEFFICIENT DIGITAL FILTER

[75] Inventors: Masahiro Kakishita; Hiroshi Katsumoto, both of Tokyo, Japan

[73] Assignee: Akai Electric Co. Ltd., Tokyo, Japan

[21] Appl. No.: 844,089

[22] Filed: Mar. 26, 1986

[30] Foreign Application Priority Data

Mar. 27, 1985 [JP] Japan .................................. 60-64773
Jun. 14, 1985 [JP] Japan .................................. 60-130521

[51] Int. Cl.$^4$ .......................... G06F 7/38; G10H 1/12
[52] U.S. Cl. .................. 364/724.19; 84/1.19; 84/DIG. 9; 381/51
[58] Field of Search ...................... 84/1.01, 1.19, 1.21, 84/1.22, DIG. 9; 381/51, 53; 364/724

[56] References Cited

U.S. PATENT DOCUMENTS 4,433,604  2/1984  Ott ........................................ 84/1.19
4,554,358  11/1980 Wuchi et al. ........................ 84/1.22
4,703,447  10/1987 Lake, Jr. ............................. 364/724

Primary Examiner—Stanley J. Witkowski
Attorney, Agent, or Firm—Donald D. Mon

[57] ABSTRACT

A time-changing coefficient digital filter having a data RAM for storing input data, a purality of N data registers at the output of the data RAM forming a delay element, a coefficient RAM storing coefficient values, coefficient registers temporarily storing respective coefficients, and a multiplier for multiplying data read out of data registers and coefficient registers respectively. Data from the multiplier and inputs is accumulated in an adder. Coefficient registers and data registers are updated by data from the data RAM and coefficient RAM. The coefficient digital filter provides a sum of products sequentially read out of the coefficient and data registers. The digital filter is applied to produce a musical instrumet having improved tonal qualities.

3 Claims, 4 Drawing Sheets (a)

(b)

(c)

(d)

(a)

(b)

(c)

(d)

PROGRAMMED TIME-CHANGING COEFFICIENT DIGITAL FILTER

FIELD OF THE INVENTION

The present invention relates to a programmed time-changing coefficient digital filter a coefficient of which is changed with time. More specifically, the present invention relates to an electronic musical instrument, particularly to an instrument to reproduce tones of conventional musical instruments by using a memory.

BACKGROUND OF THE INVENTION

An example of previously know N-time cyclic filters is shown in a block diagram in FIG. 2. In the figure, numbers 1 through 4 indicate unit delay elements providing a unit delay D each, which are connected in series; 5 is an input adder; 6 is an output adder; 7 through 14 are multipliers for weighing the unit delay elements 1 through 4 by coefficients $a_1$, $a_2$, $a_{N-1}$, $a_N$, $b_1$, $b_2$, $b_{N-1}$ and $b_N$, respectively, the multiplier 7 being connected between an output of the unit delay element 1 and the input adder 5, the multiplier 11 being connected between the output of the unit delay element 1 and the output adder 6, the multiplier 8 being connected between an output of the unit delay element 2 and the input adder 5, the multipler 12 being connected between the output of the unit delay element 2 and the output adder 6, the multipler 9 being connected an output of the unit delay element 3 and the input adder 5, the multiplier 13 being connected between the output of the unit delay element 3 and the output adder 6, the multiplier 10 being connected between an output of the unit delay element 4 and the input adder 5, and the multiplier 14 being connected to between the output of the unit delay element 4 and the output adder 6.

A system function H(z) of the N-time cyclic filer shown in FIG. 2 is given as $$H_{(z)} = \frac{1 + b_{-1}z^{-1} + b_2 z^{-2} + \ldots + b_{N-1}z^{-(N-1)} + b_N z^{-N}}{1 - a_1 z^{-1} - a_2 z^{-2} - \ldots - a_{N-1}Z^{-(N-1)} - a_N Z^{-N}}$$

$$= \frac{1 + \sum_{i=1}^{N} b_i z^{-i}}{1 - \sum_{i=1}^{N} a_i z^{-i}}$$

where x is an input data, y is an output data and z is a unit delay operator. There are shown delay data $D_0$, $D_1$, $D_2$ to $D_{N-1}$ and $D_N$ across the respective unit delay elements 1, 2, 3 and 4. To obtain the output data y, it is required to perform 2N times of multiplication, 2N times of addition and 2N times of update of the delay data $D_0$, $D_1$, $D_2$ to $D_{N-1}$ and $D_N$. This can be expressed as $$D_0 = x + a_1 D_1 + a_2 D_2 \ldots + a_{N-1}D_{N-1} - a_N D_N$$

$$y = D_0 + b_1 D_1 + b_2 D_2 \ldots + b_{N-1}D_{N-1} + b_N D_N$$

$$D_N \rightarrow D_{N-1}, \ldots, D_2 \rightarrow D_1, D_1 \rightarrow D_0$$

As described above, the previous N-time cyclic filers can process known digital signals; but, they cannot process signals for which coefficients have to be rewritten in a real time fashion because they have no means for writing the coefficients in the real time fashion.

In addition, it has previously been proposed to provide a method of musical tone generation that a semiconductor memory has a wave or a plurality of waves stored for every semitone in a whole tone range over which the electronic musical instrument covers and the wave or waves are read with a specific sampling interval. Also, it has previously been proposed to provide another method of musical tone generation that a semiconductor memory stores a wave or a plurality of waves of a specific tone or a plurality of specific tones in a whole tone range over which the electronic musical instrument covers and the wave or waves are read with a variable sampling time.

The electronic musical instruments constructed in the above mentioned methods read the wave or waves at a particular sampling rate, or have waveform data corresponding to the respective pitch detectors such as keys thereof to change the pitch at a variable sampling rate. Such electronic musical instruments involve a problem that enormous memory capacity is needed as the amount of addresses becomes large when the pitch is lowered.

Further, it has previously been proposed to provide a method that a memory has a wave or waves of a very long address or addresses stored with a bandwidth limited, sampled values are extracted appropriately, and the wave or waves are output at a specific sampling rate. This method, also, needs enormous addresses to reproduce correct tones. The method, further, involves a difficulty in generating tones in a wider frequency range. The difficulty leads to a problem of folded error due to generation of a higher frequency tone when the tone needs to contain particularly high harmonics.

Furthermore, an electronic musical instrument that the wave or waves are read from at the variable sampling rate, involves a problem that a single D/A converter cannot function in a time-division multiprocess way; but, a plurality of D/A converters are needed to generate a multi-tone at one time.

More particularly, two of the N-time cyclic filters are of a type more specifically set forth in Japanese Laying-Open Patent Gazette No. 60-22192 issued Feb. 4, 1985 to Tahiro Murase. The electronic musical instrument disclosed in this gazette comprises a data memory for storing synthesized tone data, a data reader for reading the synthesized tone data from the data memory, and a waveform generator for generating a musical tone by using the synthesized tone data read by the data reader.

Furthermore particularly, two of the N-time cyclic filters are of a type more specifically set forth in Japanese Laying-Open Patent Gazette No. 59-136790 issued Aug. 6, 1984 to Tahiro Murase et al. The musical tone generation instrument disclosed in the gazette comprises a waveform memory for storing at least two of a plurality of musical tone waveforms from start of a tone generation to end, a note clock generator for determining a musical scale, a waveform reader for reading two waveform sampled data from the waveform memory depending on a signal output of the note clock generator, a waveform calculator for forming the musical waveform by using the two waveform sampled data read by the waveform reader, and a converter for converting to analog the digital signal output of the waveform calculator.

OBJECTS AND ADVANTAGES OF THE INVENTION

It is therefore an object of the present invention to provide a novel programmed time-changing coefficient digital filter by which digital signals can be processed in a real time fashion.

It is another object of the present invention to provide an electronic musical instrument that can reproduce tones closely approximated to those of conventional musical instruments in a simple construction with use of less memory capacity.

It is further object of the present invention to provide an electronic musical instrument that is free from deterioration of tone quality due to signal processing and transmission in a fully digitalized processing fashion.

The foregoing objects and advantages and other more specific objects will be evident when proceeding through the following detailed description and schematic of the preferred embodiments of the present invention, particularly when considered in connection with the accompanying drawings.

SUMMARY OF THE INVENTION

In carrying out the present invention in one preferred mode, the programmed time-changing coefficient digital filter consists chiefly of a data RAM for temporarily storing input data, N units of data registers connected to an output of the data RAM to form a delay element, a coefficient RAM for storing coefficients, 2N units of coefficient registers for temporarily storing the respective coefficients, a coefficient control for replacing contents of the coefficient registers by contents of the coefficient RAM, a multiplier for multiplying delayed data and coefficients read out of the data registers and the coefficient registers respectively, and an adder for accumulating data output of the multiplier and the input data. Also, the programmed time-changing coefficient digital filter has means for replacing the contents of the coefficient registers by the contents of the coefficient RAM depending on signal processing, and means for transferring the delayed data between the data registers and data RAM to update the delayed data in the data register.

The programmed time-change coefficient digital filter provides a sum of products of the coefficients sequentially read out of the coefficient registers and the delayed data read out of the data registers selected sequentially.

The programmed time-changing coefficient digital filter may have an external means for replacing the contents of the coefficient RAM.

DETAILED DESCRIPTION OF THE INVENTION

As previously noted, the present invention involves an improved programmmed time-changing coefficient digital filter. For a previous time-changing N-time cyclic filter, a system function H(z) is represented in terms of time, and $a_i$ and $b_i$ also vary with time. The system function $H(z, nT)$ can be represented as $$H(z,nT) = \frac{1 + \sum_{i=1}^{N} b_i^n z^{-i}}{1 - \sum_{i=1}^{N} a_i^n z^{-i}}$$

where T is a sampling interval, N is number of cycles, and $a_i^n$ and $b_i^n$ are coefficients at an instance nT.

Figure 1:
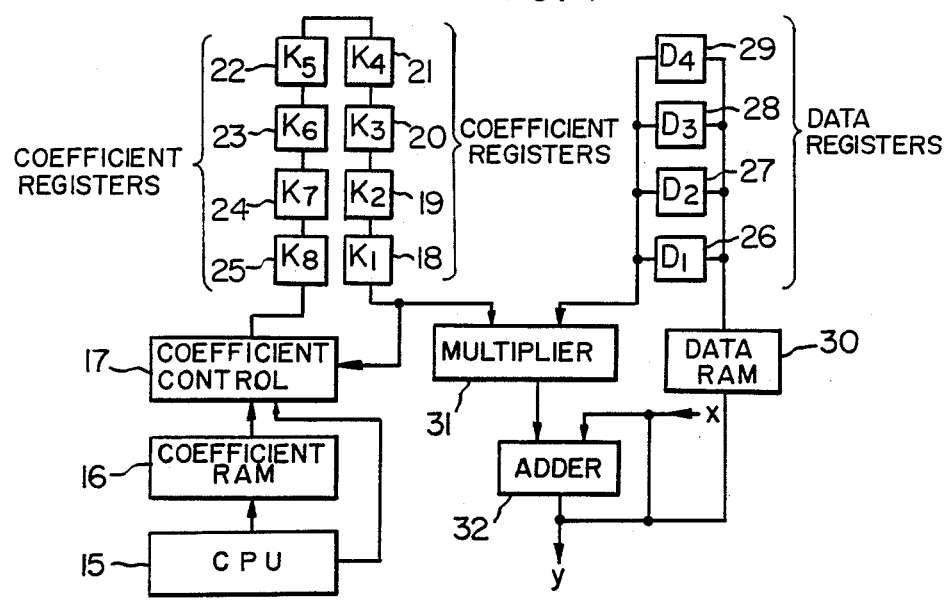
FIG. 1 shows a block diagram of an preferred embodiment of the present invention.
Figure 2:
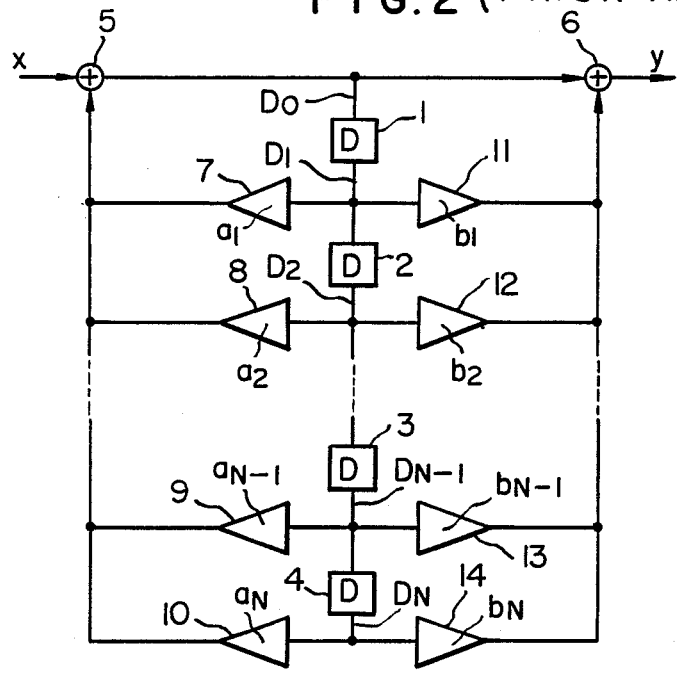
FIG. 2 is a block diagram of a previous N-time cyclic filter.

In FIG. 1 is shown a programmed 4-time cyclic digital filter in a block diagram fashion as an preferred embodiment of the present invention where the number of cycles N is 4. This preferred embodiment can function as the programmmed 4-time cyclic digital filter in a manner that coefficients at an instance can be stored into a coefficient RAM used for a period of time in which all signals are processed, and can be sequentially stored into coefficient registers 18 through 25. Before the signal processing starts, the coefficients at an instance nT can be calculated by an external CPU that is an coefficient update means. The updated coefficients, then, can be stored into the coefficient RAM 16 and also can be sequentially stored into the coefficient registers 18 through 25 via a coefficient control 17. The coefficients that have been stored in the coefficient registers before the start of signal processing are the first coefficients used at the same time as the signal process.

If the period of time for the signal process is rather short, the coefficients for all process times n can be calculated and stored into the coefficient RAM 16. To make calculation and storing possible for a longer period of time for the signal process, some provision must be divised. It is difficult to calculate and store into the coefficient RAM 16 the coefficients for all process times n in the way mentioned above.

To overcome such a difficulty, the process time n is divided into M intervals, with an assumption that the coefficients do not change for the respective intervals. In this way, the preferred embodiment may need 8M coefficients in total as the coefficients $a_i^m$ and $b_i^m$ are $a_i^m$: m=0, 1, 2, ... M−1, i=1, 2, 3, 4

$b_i^m$: m=0, 1, 2, ... M−1, i=1, 2, 3, 4

The process time n divided into the M intervals is in relation with divided time $N_m$ and $N_{m+1}$ as $N_m < n \leq N_{m+1}$ m=0, 1, 2, ... M−1 where m is 0, 1, 2 through M−1 and No is 0. The divided time $N_m$ can be stored into a coefficient control 17 through the external CPU 15 as with the coefficients. The coefficient control 17 has a counter that always compares the current process time n and the divided time $N_m$.

The coefficient registers 18 through 25 has coefficients $K_1$ through $K_8$ stored respectively. The coefficients stored in the coefficient registers 18 through 25 at the start of the signal process are $$K_1 \leftarrow a_1^0, K_2 \leftarrow a_2^0, K_3 \leftarrow a_3^0$$

$$K_4 \leftarrow a_4^0, K_5 \leftarrow b_1^0, K_6 \leftarrow b_2^0, K_7 \leftarrow b_3^0, K_8 \leftarrow b_4^0$$

Data registers 26 through 29 are all initiated to 0; that is, data $D_1$ through $D_4$ are all 0.

The following describe the signal process for the process time n which is in relation as $N_m \leq n < N_{m+1}$. The contents of the coefficient registers 18 through 25 are $$K_1 \leftarrow a_1^m, K_2 \leftarrow a_2^m, K_3 \leftarrow a_3^m, K_4 \leftarrow a_4^m, K_5$$
$$\leftarrow b_1^m, K_6 \leftarrow b_2^m, K_7 \leftarrow b_3^m, K_8 \leftarrow b_4^m$$

The coefficient $a_1$ read out of the coefficient register 18 and the data D1 read out of the data register 26 are delivered to the multiplier 31. The output of the multiplier 31 and the input data x are delivered to the adder 32.

At the same time as the coefficient $a_1$ is read out of the coefficient register 18, the contents of the coefficient registers 18 through 25 are shifted as $$K_1 \leftarrow a_2^m, K_2 \leftarrow a_3^m, K_3 \leftarrow a_4^m, K_4 \leftarrow b_1^m, K_5 \leftarrow b_2^m,$$
$$K_6 \leftarrow b_3^m, K_7 \leftarrow b_4^m$$

A comparator of the coefficient control 17, then, compares a value of n+1 of a counter thereof with a value of $N_{m+1}$. If $n+1 \neq N_m$, the read-out coefficient $a_1^m$ is entered in the coefficient register 25 to make this $K_8 \leftarrow a_1^m$. If $n+1 = N_m$, on the other hand, the coefficient $a_1^{m+1}$ is read out of the coefficient RAM and is entered in the coefficient register 25 to make this $K_8 \leftarrow a_1^{m+1}$. That is, if $n+1 = N_m$, the coefficient registers 18 through 25 are shifted as $$K_1 \leftarrow b_1^m, K_2 \leftarrow b_2^m, K_3 \leftarrow b_3^m, K_4 \leftarrow b_4^m,$$
$$K_5 \leftarrow a_1^{m+1}, K_6 \leftarrow a_2^{m+1}, K_7 \leftarrow a_3^{m+1},$$
$$K_8 \leftarrow a_4^{m+1}$$

The output of the adder 32 is $x + a_1^m D_1$, which is delivered to the adder 32 itself again. The next coefficient $a_2^m$ is also read out of the coefficient register 18 and then delivered to the multiplier 31 together with the data $D_2$ read out of the data register 27. The output of the multiplier 31 becomes $a_2^m D_2$, which is delivered to the adder 32. In the adder 32, this data is added to the preceding data $x + a_1^m D_1$, resulting in $x + a_1^m D_1 + a_2^m D_2$.

The above-mentioned process is repeated four times. The resulting output $D_0$ of the adder 32 is $$D_0 = x + a_1^m D_1 + a_2^m D_2 + a_3^m D_3 + a_4^m D_4$$

This result is temporarily stored in a data RAM 30. The contents of the coefficient registers 18 through 25, then, become $$K_1 \leftarrow b_1^m, K_2 \leftarrow b_2^m, K_3 \leftarrow b_3^m, K_4 \leftarrow b_4^m,$$
$$K_5 \leftarrow a_1^{m+1}, K_6 \leftarrow a_2^{m+1}, K_7 \leftarrow a_3^{m+1},$$
$$K_8 \leftarrow a_4^{m+1}$$

The same multiplication, the same addition and the same shift of the coefficient registers 18 through 25 are made four times, each. The resulting output of the adder 32 becomes $$y = D_0 + b_1^m D_1 + b_2^m D_2 + b_3^m D_3 + b_4^m D_4$$

In addition, the delayed data $D_1$, $D_2$, $D_3$ and $D_4$ are updated four times by the data RAM 30 and the Data registers 26, 27, 28 and 29 as $$D_4 \leftarrow D_3, D_3 \leftarrow D_2, D_2 \leftarrow D_1, D_1 \leftarrow D_0$$

That is, the data $D_0$ of the data RAM 30 is updated to $D_4$. This completes the process for the single input data x.

At that time, the contents of the coefficient registers 18 through 25 become $$K_1 \leftarrow a_1^{m+1}, K_2 \leftarrow a_2^{m+1}, K_3 \leftarrow a_3^{m+1}, K_4 \leftarrow a_4^{m+1},$$
$$K_5 \leftarrow b_1^{m+1}, K_6 \leftarrow b_2^{m+1}, K_7 \leftarrow b_3^{m+1},$$
$$K_8 \leftarrow b_4^{m+1}$$

Thus, this allows the process for the next input data x to be carried out in a continuous way. This means that the signal process can be continuously performed by repeating the above-mentioned operation even when the coefficients can be changed.

As described in the above-mentioned preferred embodiment according to the present invention, the time-changing coefficient digital filtration process can be carried out in real time in the way that the coefficients are stored in the coefficient RAM and the coefficient registers.

In the above preferred embodiment, the coefficients can be changed in the course of the signal process with the external CPU implemented.

Figure 3:
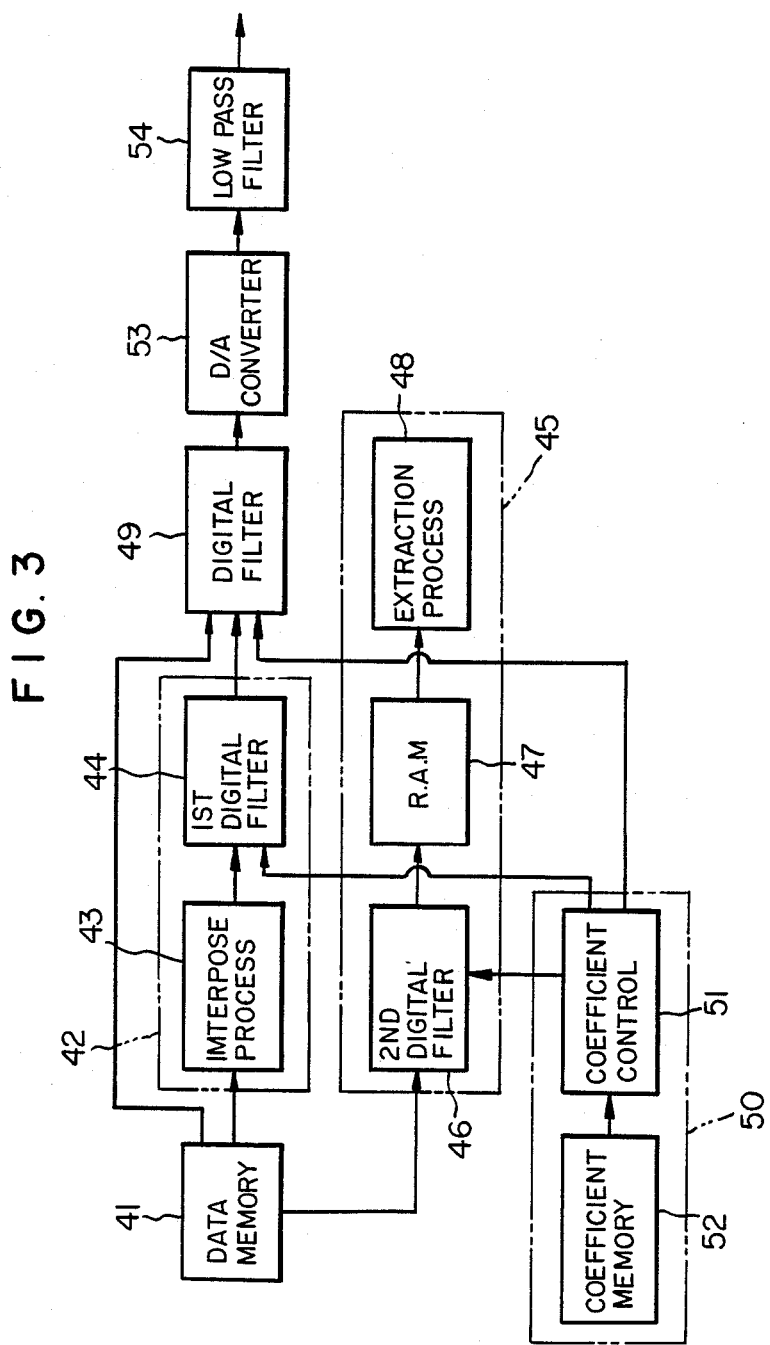
FIG. 3 is a block diagram of another preferred embodiment of the present invention.

The followings describes another preferred embodiment, that is, an electronic musical instrument, according to the present invention. In a data memory 41 (ROM) in FIG. 3 has been stored data of waveforms sampled of twelve semitones in an octave selected specifically from among all octaves over which the electronic musical instrument covers. An output read out of the data memory 41 is input to a bass processor 42, a treble processor 45 or a time-changing coefficient digital filter 49 (simply "digital filter" in the figure). If a tone of the octave stored in the data memory 41 is to sound directly, the output of the data memory 41 is directly input to the time-changing coefficient digital filter 49; if a tone of an octave lower than the one stored is to sound, the output is input to the bass processor 42; or, if a tone of an octave higher than the one stored is to sound, the output is input to the treble processor 45.

The bass processor 42 comprises an interpose processor 43 and a 1st digital filter 44. The interpose process 43 performs zero-point interposition of the output of the data memory 41. The interposed signal is input through the 1st digital filter 44 to the time-changing coefficient digital filter 49. The treble processor 45 comprises a 2nd digital filter 46, a RAM 47 and an extraction process 48. The output signal of the data memory 41 is input to the 2nd digital filter 46, which filtrates the output signal in a digital fashion appropriately to allow the extraction process 48 to make extracation process. The filtrated signal is input to the RAM 47 that makes a sampling interval of the 2nd digital filter equal to that of the 1st digital filter 44 and the time-changing coefficient digital filter 49. The signal, then, undergoes the extraction process through the extraction process 48. After this, the signal is input to the time-changing coefficient digital filter 49.

The time-changing coefficient digital filter 49 makes an envelope of spectrum of the signal approximate to that of an actual musical tone signal. The approximated signal is input to a D/A converter 53.

A coefficient setting means 50 shown comprises a coefficient memory 52 (RAM) and a coefficient control 51. The coefficient memory 52 stores coefficients that are used to change respective coefficients of the 1st digital filter 44, the 2nd digital filter 46 and the time-changing coefficient digital filter 49 according to periods of time from start of sounding of a selected or any desired signal tone to end thereof. The coefficient control 51 changes the coefficients as described above.

As described above, the 1st digital filter 44, the 2nd digital filter 46 and the time-changing coefficient digital filter 49 can perform arithmetic operation in the same sampling interval. The digital filtration of each of the digital filters can be executed by a single digital signal processor, abbreviated DSP, (not shown).

The signal output of the time-changing coefficient digital filter 49 is converted to an analog musical tone signal through the D/A converter 53. The analog musical tone signal is output through a low bass filter 54.

Figure 4:
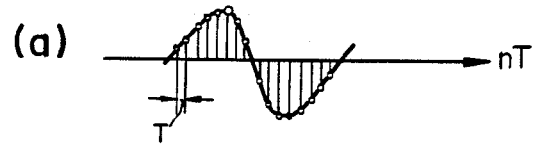
FIGS. 4(a)-4(d) show waveforms of sampled semitones in a bass range.
Figure 4:
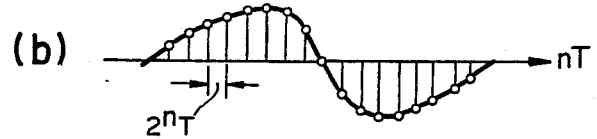
Figure 4:
Figure 4:

The followings describes how the electronic musical instrument according to the present invention can operate. First, the operation of the bass processor 42 described operates as follows. In the data memory 41 has been stored only data of twelve semitones of an octave selected specifically from among all octaves over which the electronic musical instrument can cover. The bass processor 42 can read out a semitone in a time as long as $2^n$ multiplied by a read-out sampling interval T which depends on the sampled data and a pitch of the selected tone signal, n assuming 0, 1, 2 and so on. This can obtain a tone signal n octaves lower than the specifically selected octave, as illustrated in FIGS. 4(a)-(d). FIG. 4(a) shows that the sampled data is read out in the read-out sampling interval T. FIG. 4(b) is that the sampled data is read out in the read-out sampling interval $2^n T$. The sampled data undergoes the zero-interposition through the interpose processor 43 so that the original sampling interval can be made to equal to the original sampling interval T from $2^n T$ before the zero-interposition, that is, n zero values are interposed between the sampled data read out in $2^n T$. FIG. 4(c) shows that the sampled data is read where n=1. FIG. 4(d) is a waveform obtained in the way that sampled data is passed through the 1st low pass filter 44.

Figure 5:
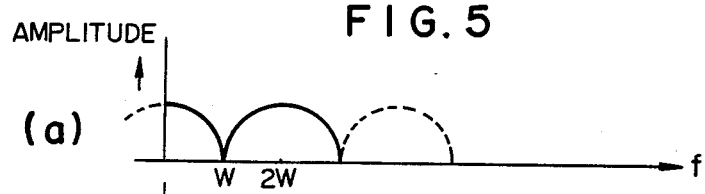
FIGS. 5(a)-5(d) show spectrum diagrams for the waveforms in FIGS. 4(a)-4(d).
Figure 5:
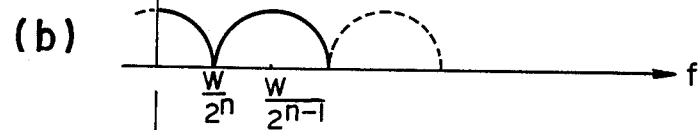
Figure 5:
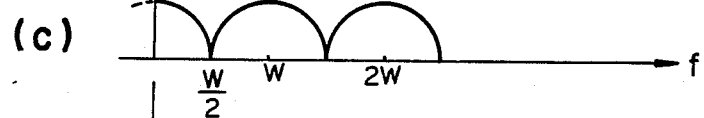
Figure 5:

FIGS. 5(a)-(d) show spectrum ranges of the waveform of the sampled data. FIG. 5(a) is the spectrum of the waveform in FIG. 4(a). Similarly, FIG. 5(b) is the spectrum of the waveform in FIG. 4(b), and so on. The spectra, as well known, cannot be changed with the zero-point interpolation. The spectrum of the waveform of FIG. 4(b), therefore, becomes the one in FIG. 5(c) by the zero-point interpolation.

The D/A converter 53 has the analog low pass filter 54 connected to the output as usual. The low pass filter 54 cuts off at a frequency W. In FIG. 5(a), the components higher than W are cut off by the low pass filter 54. In FIG. 5(c), however a band of W/2 to W cannot be cut off by the low pass filter 54. To cut these off, the 1st digital filter 44 is provided to filter the waveform in FIG. 4(c) to remove this band. The resulting waveform is the one in FIG. 4(d), and resulting spectrum is in FIG. 5(d).

Figure 6:
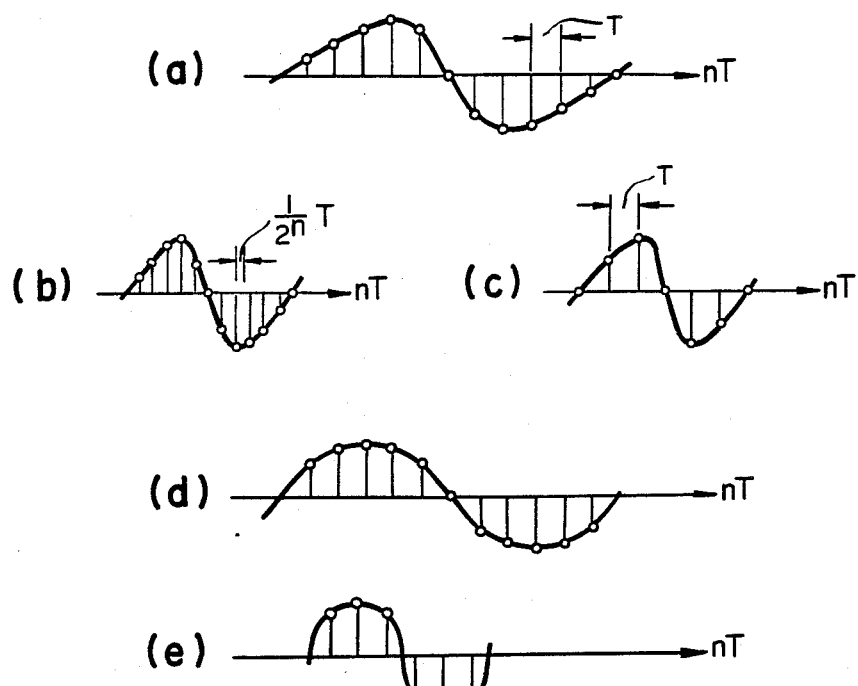
FIGS. 6(a)-6(e) show waveforms of sampled semitones in a treble range.

Second, operation of the treble processor 45 is described as follows. FIG. 6(a) shows a waveform read in the specific read-out sampling interval T from the digital data memory 41, with the spectrum thereof shown in FIG. 7(a). When the waveform in FIG. 6(b) is read in the sampling interval $\frac{1}{2^n}T$ can be n octaves higher than the one in FIG. 6(a) which is read in the sampling interval T from the digital memory 41. The sampling interval $\frac{1}{2^n}T$, however, cannot be returned to T by extracting n point values for the waveform in FIG. 6(b) as it was.

As an example, the waveform with n=1 is shown in FIG. 6(c). The resulting spectrum is a sum of the original spectrum shifted by $2\pi/n$ and the origitanl spectrum, being shown in FIG. 7(b). As seen from this spectrum, the original spectrum components are completely destroyed by folded error.

Figure 7:
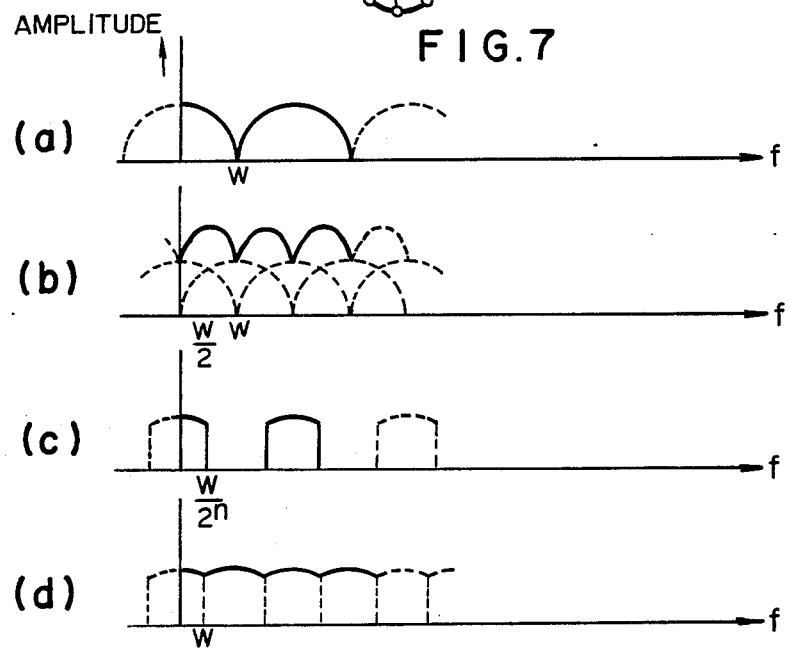
FIGS. 7(a)-7(d) show spectrum diagrams for the waveforms in FIGS. 6(a)-6(e).

To resolve such a problem, the 2nd digital filter 46 is provided to low-pass the waveform in FIG. 6(d) by the digital operation. The resulting spectrum is shown in FIG. 7(c). One wave thereof is stored in the RAM 47 at a time, and then is read therefrom in the sampling interval $T/2^n$. From the one wave are extracted the n point values. The resulting waveform is shown in FIG. 6(e), and the spectrum corresponding thereto is in FIG. 5(d). It should be noted that frequency components higher than W are unnecessary because the D/A converter 53 has in connection to the output thereof the analog low pass filter 54 that can cut off at W.

It may happen to require a tone signal of a frquency n octaves higher than the one read in the sampling interval T from the data memory 41. Frequencies higher than W/2n, then, can be cut off in the filtration operation as shown in FIG. 7(c), and the waveform can be read in the read-out sampling interval $T/2^n$ to extract the n point values. The frequency components of the waveform in FIG. 6(b) lower than W, then, can be reserved. The resulting spectrum is shown in FIG. 7(d). The extraction of the n point values mentioned above can be performed by the extraction process 48. This can make the sampling interval T contant.

With the process described above, the input and output sampling interval T of the 1st digital filter 44, the 2nd digital filter 46 and the time-changing coefficient digital filter 49 can be held constant. This feature allows obtaining waveforms in a wider frequency range from the single wave data sampled of a single wave of each of the twelve semitones in one octave without destruction of necessary frequency components.

As the sampling time T is constant, the 1st digital filter 44, the second digital filter 46 and the time-changing coefficient digital filter 49 can be formed of a single digital signal processor each to process tone signals in a time-division multiprocess manner. An electronic musical instrument that can generate multi-tones in a polyphonic manner, also, can process the multi-tones in a time-division multiprocess manner, at the sampling interval T upon input of the multi-tones to the digital filters with pitches thereof.

The time-changing coefficient digital filter 49 can be said as a replacement for a voltage-controlled filter found in electronic musical instruments of analog reduction type. In operation, one wave stored in the data memory 41 or one wave stored in the RAM 47 is read out in a repeated loop manner, and harmonic components of thereof are time-controlled by the time-changing coefficient digital filter 49, to approximate the tone of the electronic musical instrument to that of a conventional time-changing musical instrument.

If such a process is to be made in an analog fashion, the voltage-controlled filter is used in place of the time-changing coefficient digital filter 49. To generate a multi-tone at one time, a plurality of the voltage-controlled filters have to be used as the above-mentioned time-division multiprocess method cannot be employed. The analog method involves higher deterioration and lower signal-to-noise ratio.

In the embodiment, also, the D/A converter 53 can perform the above-mentioned time-division multiprocess of the multi-tone only with use of several additional buffers as the sampling interval T is constant.

It will be appreciated that as seen from the above description, the embodiment can be constructed in a simple way with less numbers of hardware components.

Also, it will be appreciated that a memory capacity can be saved as the memory capacity required is to store only single wave of each of the twelve semitones.

Further, it will be appreciated that no deterioration of the tone signal cannot be caused in the signal process as this can be made during the total sampling interval T in the digital fashion. To reproduce higher frequency signal components to a nth harmonics, for example, only data of one wave having 2n point values sampled is required as found from the sampling theorum. As this involves no difficult technique, the reproduced tone signal can contain rather higher correct harmonics. The harmonics in the reproduced tone signal is free from unnecessary noises, such as the folded error, in a bandwidth required. This means that a correct musical tone can be reproduced.

What is claimed is:

1. A programmed time-changing coefficient digital filter comprising;
    data storing RAM means for temporarily storing input data;
    a plurality of N data registers connected to the output of said data storing RAM means forming a delay means;
    coefficient RAM storage means for storing coefficients;
    a plurality of 2 N coefficient registers for temporarily storing respective coefficients;
    coefficient control means for updating said plurality of 2 N coefficient registers by replacing coefficient values stored in said plurality of 2 N coefficient registers with coefficient values from said coefficient RAM means;
    multiplying means for multiplying delayed data and coefficients read out from said data registers and coefficient registers respectively;
    adder means receiving the output of said multiplying means for accumulating output data from said multiplying means and input data;
    means in said coefficient control means for replacing the coefficient values in said plurality of 2 N coefficient registers with coefficient values from said coefficient RAM means when signal processing time is a predetermined value;
    transfer means for transferring data between said plurality of N data registers and said data RAM to update delayed data in said data register;
    whereby a sum of the products of coefficients sequentially read out of said plurality of 2 N coefficient registers and delayed data sequentially read out of said plurality of N data registers is provided.

2. The coefficient filter according to claim 1 including external coefficient replacing means connected to said coefficient RAM means for selectively replacing coefficient values in said coefficient RAM means.

3. The coefficient filter according to claim 2 in which said external replacing means comprises a programmable computer processing unit.

* * * * *